US007858437B2

(12) United States Patent
Jung et al.

(10) Patent No.: US 7,858,437 B2

(45) **Date of Patent: *Dec. 28, 2010**

(54) METHOD FOR MANUFACTURING A SUBSTRATE WITH CAVITY

(75) Inventors: Hoe-Ku Jung, Daejeon (KR); Myung-Sam Kang, Daejeon (KR); Ji-Eun Kim, Gwangmyeong-si (KR); Jung-Hyun Park, Cheongju-si (KR)

(73) Assignee: Samsung Electro-Mechanics Co., Ltd., Suwon (KR)

(*) Notice: Subject to any disclaimer, the term of this patent is extended or adjusted under 35 U.S.C. 154(b) by 63 days.

This patent is subject to a terminal disclaimer.

(21) Appl. No.: 11/706,186

(22) Filed: Feb. 15, 2007

(65) Prior Publication Data

US 2007/0190764 A1 Aug. 16, 2007

(30) Foreign Application Priority Data

Feb. 16, 2006 (KR) ..................... 10-2006-0014918

(51) Int. Cl.
*H01L 21/44* (2006.01)

(52) U.S. Cl. ....................... 438/108; 438/107; 438/125; 438/118; 438/613; 257/734; 257/E21.503

(58) Field of Classification Search ................. 438/584, 438/107–110, 125, 118, 613, 615, 618, 687; 257/734, E21.503, E23.021, 508
See application file for complete search history.

(56) References Cited

U.S. PATENT DOCUMENTS 5,858,816 A * 1/1999 Sato et al. ................... 438/125
6,242,079 B1 * 6/2001 Mikado et al. .............. 428/209
6,324,067 B1 * 11/2001 Nishiyama .................. 361/761
6,724,638 B1 * 4/2004 Inagaki et al. ............... 361/763

(Continued)

FOREIGN PATENT DOCUMENTS

JP 9-36549 A 2/1997

(Continued)

OTHER PUBLICATIONS

Office Action issued in corresponding Chinese Patent Application No. 2007100793501 on Jun. 20, 2008.

(Continued)

*Primary Examiner*—Lynne A. Gurley
*Assistant Examiner*—Junghwa M Im

(57) ABSTRACT

An aspect of the present invention features a method for manufacturing a substrate having a cavity. The method can comprises: (a) forming an upper layer circuit on an upper seed layer; (b) laminating a dry film on a portion of the upper seed layer where a cavity is to be formed; (c) fabricating an upper outer layer by forming an insulation layer on top of the upper seed layer and on top and sides of the upper layer circuit; (d) stacking the upper outer layer on one side of a core layer where an internal circuit is formed; (e) removing the upper seed layer; and (f) forming the cavity by removing the dry film. The method for manufacturing a substrate with a cavity according to the present invention can reduce the total thickness of the substrate while the thickness of an insulation layer remains the same, by forming the insulation layer on sides of an external circuit.

2 Claims, 7 Drawing Sheets

U.S. PATENT DOCUMENTS

| | | | | |
|---|---|---|---|---|
| 7,494,844 | B2 * | 2/2009 | Jung et al. | 438/108 |
| 2005/0230835 | A1 * | 10/2005 | Sunohara et al. | 257/758 |
| 2006/0237225 | A1 * | 10/2006 | Kariya et al. | 174/260 |

FOREIGN PATENT DOCUMENTS

| | | | |
|---|---|---|---|
| JP | 2003-243837 | A | 8/2003 |
| JP | 2005-129899 | | 5/2005 |

OTHER PUBLICATIONS

Japanese Office Action dated Jan. 19, 2010 and issued in corresponding Japanese Patent Application 2007-007727.

* cited by examiner (a)
(k)
530
(k')
530
520
510
(b)
530
520
510
(c)
530
540
520
510

METHOD FOR MANUFACTURING A SUBSTRATE WITH CAVITY

CROSS-REFERENCE TO RELATED APPLICATIONS

This application claims the benefit of Korean Patent Application No. 10-2006-0014918 filed with the Korean Intellectual Property Office on Feb. 16, 2006, the disclosures of which are incorporated herein by reference in their entirety.

BACKGROUND

1. Technical Field

The present invention relates to a stacked-type semiconductor packaging module, more specifically to a method for manufacturing a substrate, on which a cavity is formed.

2. Description of the Related Art

With the development of the electronics industry, there has been increasing demands for electronic parts that perform better and are smaller. To accommodate these demands, the semiconductor packing technologies have been evolving from packing one integrated circuit on one substrate to packing several integrated circuits on one substrate. Moreover, to address the need for realizing high-performance, high-density packages, and to meet the demand for these packages, the "package on package (POP)" technology has been introduced. However, minimizing the thickness of the package has been a challenge to overcome for successful implementation of the POP technology.

FIG. 1 is a sectional view of a package on package in accordance with the prior art. FIG. 1 shows a lower package 110, an upper package 120, an upper solder ball 103, and a lower solder ball 140.

The conventional ball grid array (BGA) semiconductor package has a substrate body, in which a plurality of patterned conductive wires are installed. On top of the substrate body are a plurality of chip pads, to which semiconductor chips are wire-bonded. In addition, some portion of the top of the substrate body is molded with an epoxy compound and forms a molding part, such that the semiconductor chip and metal wire are enveloped. Adhered to the bottom of the substrate are a plurality of solder balls such that the other ends of the conductive wires installed in the substrate can be connected. This structure of a conventional ball grip array semiconductor package is too thick to be stacked as a highly integrated memory module within a limited portion.

The lower package 110 of the conventional package on package has a dual-level structure, and an integrated circuit is mounted on the surface of this substrate. The substrate of the lower package 110 is manufactured in the same method as manufacturing a general printed circuit board. The increasing density in the semiconductor package module necessitates the mounting of a plurality of integrated circuits. With the conventional method, it is difficult to increase the mounting in the lower package 110 while maintaining the total thickness of the package on package. The die-thinning method, which reduces the thickness of a semiconductor chip, can be one way of reducing the thickness, but this raises the issue of function-error with a prolonged operation. Therefore, improvement in mounting capacity of the package on package is attempted by reducing the thickness of the substrate.

Also, circuit wires are formed on insulation layers of the lower package 110 and the upper package 120, thickening the substrate used in the packages.

SUMMARY

The present invention provides a method for manufacturing a substrate with a cavity that can reduce the thickness of a package in which an integrated circuit (IC) is mounted.

Also, the present invention provides a method for manufacturing a substrate with a cavity that allows a plurality of semiconductor chips to be mounted in layers in a lower package of a package on package.

Moreover, the present invention provides a method for manufacturing a substrate with a cavity that can reduce the thickness of the substrate for a package on package having three or more layers.

In addition, the present invention provides a method for manufacturing a substrate with a cavity that can reduce the total thickness of the substrate while the thickness of an insulation layer remains the same, by forming the insulation layer on sides of an external circuit.

An aspect of the present invention features a method for manufacturing a substrate having a cavity. The method can comprises: (a) forming an upper layer circuit on an upper seed layer; (b) laminating a dry film on a portion of the upper seed layer where a cavity is to be formed; (c) fabricating an upper outer layer by forming an insulation layer on top of the upper seed layer and on top and sides of the upper layer circuit; (d) stacking the upper outer layer on one side of a core layer where an internal circuit is formed; (e) removing the upper seed layer; and (f) forming the cavity by removing the dry film.

The method can further comprise: (g) forming a lower layer circuit on a lower seed layer; (h) forming a lower outer layer by laminating an insulation layer on top of the lower seed layer and on top and sides of the lower layer circuit; (i) laminating the lower outer layer on the other side of a core layer on which the internal circuit is formed; and (j) removing the lower seed layer.

The step (c) can further comprise forming a depression in the portion where the cavity is to be formed, and laminating the insulation layer on the upper seed layer by accommodating the dry film in the depression of the insulation layer.

The method can further comprise forming a bonding pad that is electrically connected with a semiconductor chip in the cavity.

Another aspect of the present invention features a substrate with a cavity. The substrate comprises a core layer having an internal circuit formed on both sides of an insulating material, an upper outer layer that is formed on one side of the core layer and in which an upper layer circuit is formed, and a lower outer layer that is formed on the other side of the core layer and in which a lower layer circuit is formed, wherein the upper outer layer further comprises an insulation layer that is extended to sides of the upper layer circuit, and in which a depression is formed to accommodate a semiconductor chip.

The substrate with a cavity can further comprise a bonding pad that is formed on an upper surface of the core layer and is accommodated in the depression of the insulation layer to be electrically connected with the semiconductor chip.

Additional aspects and advantages of the present general inventive concept will be set forth in part in the description which follows, and in part will be obvious from the description, or may be learned by practice of the general inventive concept.

BRIEF DESCRIPTION OF THE DRAWINGS

These and other features, aspects, and advantages of the present invention will become better understood with regard to the following description, appended claims, and accompanying drawings where:

DETAILED DESCRIPTION

Hereinafter, embodiments of the invention will be described in more detail with reference to the accompanying drawings. In the description with reference to the accompanying drawings, those components are rendered the same reference number that are the same or are in correspondence regardless of the figure number, and redundant explanations are omitted.

In addition, prior to describing embodiments of the present invention, a method for manufacturing a general substrate will be described first. Although a method for manufacturing a multi-layer substrate is described below, the present invention is by no means restricted to the following method for manufacturing a multi-layer substrate.

First, an internal circuit pattern is formed on the outside of a core layer. An inner-layer base material that meets the product specification is cut, and a predetermined internal circuit pattern is formed using a dry film and a working film. Here, the inner layer can be scrubbed, and an inner layer dry film can be laminated, and the inner layer can be exposed and developed.

Then, prior to bonding the inner layer, on which the circuit pattern is formed, to the outer layer, a brown (black) oxide process is carried out in order to strengthen the adhesion. That is, the surface of a copper foil is chemically oxidized to enhance the surface roughness such that the lamination results in better adhesion. Then, by laminating the inner-layer substrate and a prepreg, prelamination and lamination processes are carried out.

Then, the laminated inner layer substrate and the prepreg are vacuum pressed. It is possible that the laminated inner layer substrate and the prepreg are hot pressed or cool pressed, instead of being vacuum pressed.

The resin and copper foil are trimmed from the corners of the panel, and an X-ray target drilling process, in which a hole is made at a target guide mark on the internal circuit, is carried out in preparation of a drilling process.

Then, the drilling process is carried out for electric conduction between the layers of the substrate. Here, a computer numerical control (CNC) method can be used for the drilling process.

Then, the outer layer is coated with the dry film and the working film in order to form a circuit pattern, exposed to a light of a predetermined intensity for a predetermined duration, and the unirradiated portions are developed in an etching process. After examining the outer layer and measuring the scale, a solder resist exposure film is designed and manufactured. Then, a preprocess, such as brush polishing, in which the surface of copper foil is made rough such that the solder resist ink is better adhered to the substrate, is carried out. The solder resist is then coated; the solder resist is exposed using the solder resist exposure film, designed adaptively in the preceding process; the solder resist is removed in a development process; and a variety of post-processes, including electric/final tests, are carried out.

Figure 1:
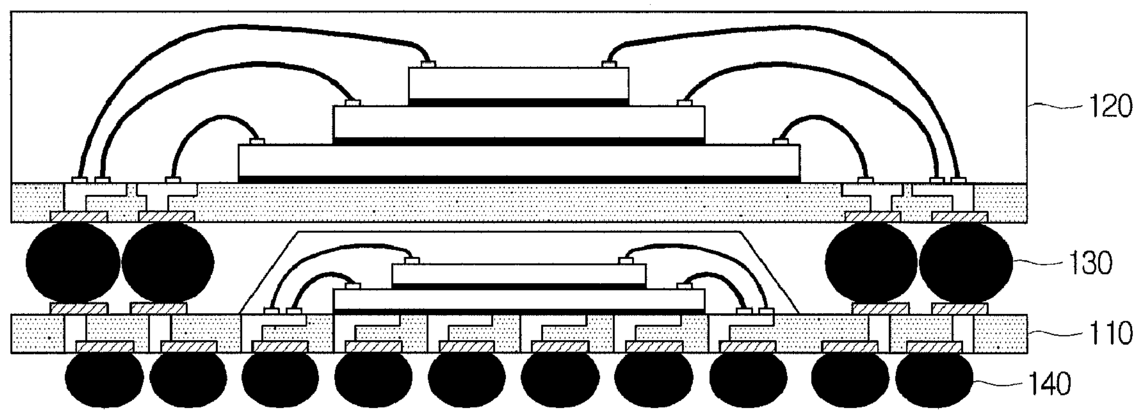
FIG. 1 is a sectional view of a package on package according to the prior art.
Figure 2:
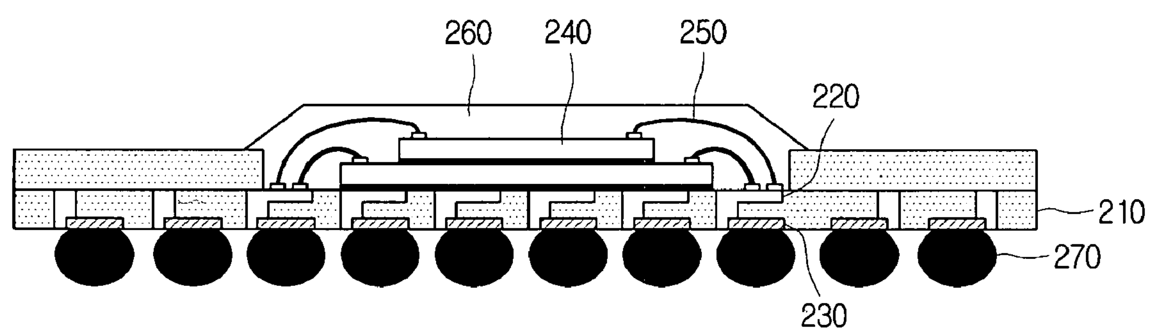
FIG. 2 is a schematic sectional view of a semiconductor package constituting a package on package according to an embodiment of the present invention.

FIG. 2 is a schematic sectional view of a semiconductor package, constituting a package on package according to an embodiment of the present invention. Referring to FIG. 2, the semiconductor package in accordance with the present invention comprises a core layer 210, a conductive wire 220, a metal pad 230, an integrated circuit 240, a metal wire 250, a molding part 260, and a solder ball 270.

According to the present invention, at least one integrated circuit 240 is seated and located in a cavity, which is formed on a substrate, in order to reduce the thickness of the semiconductor package. That is, the cavity is formed in the upper part of the core layer 210 of a package on package, using an insulation layer, and the integrated circuit 240 is inserted in the formed cavity. Then, the integrated circuit 240 is electrically coupled to the conductive circuit 220 and the metal pad 230, using the metal wire 250. Using a protective material, such as epoxy resin, the molding part is formed around and on top of the integrated circuit 240.

Figure 3:
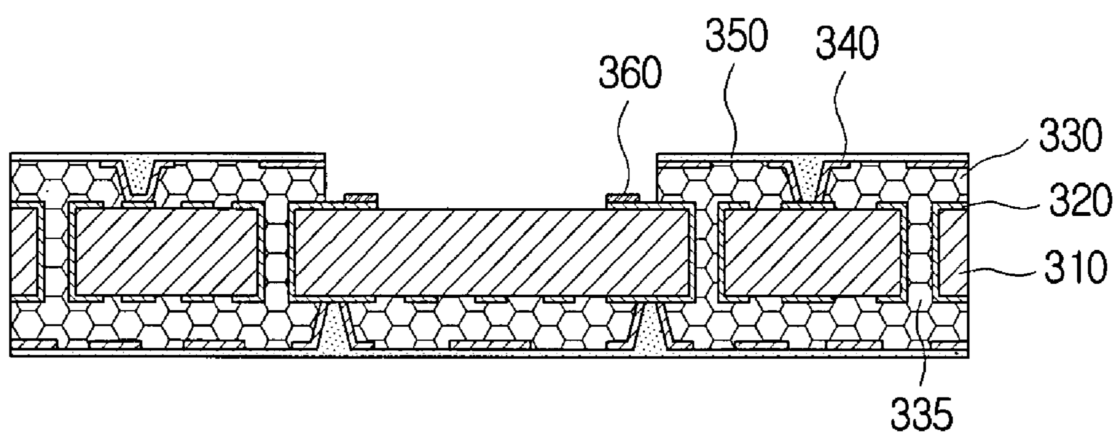
FIG. 3 is a sectional view of a package on package according to an embodiment of the present invention.

FIG. 3 is a sectional view of a package on package in which a chip is not mounted, according to an embodiment of the present invention. Referring to FIG. 3, a substrate according to the present invention includes a core layer 310, an internal circuit 320, an insulation layer 330, an interstitial via hole (IVH) 335, an external circuit 340, a photo solder resist 350; and a bonding pad 360. The core layer 310 can be a copper foil laminated base substrate having the internal circuit 320, and the insulation layer 330 can be formed of a material such as a prepreg or a resin coated copper foil (RCC). The insulation layer 330 is formed on both sides of the core layer, and is also formed between the adjacent internal circuit patterns and between the adjacent external circuit patterns, by which the top surface of the insulation layer 330 becomes level with the top surface of the external circuit 340.

Since the internal circuit 320 and the external circuit 340 are buried in the insulation layer 330, the substrate according to the present invention can be thinner even though the thickness of the insulation layer 330 is not changed.

The internal circuit 320 and the external circuit 340 can be electrically connected to each other by the IVH 335 and the BVH. Here, the internal circuit 320 and the external circuit 340 can also be electrically connected to each other by a plated through hole (PTH, not shown). The bonding pad 370 is accommodated in the cavity and connects the substrate and a semiconductor chip that will later be mounted thereon. The semiconductor chip and the substrate can be connected to each other through flip-chip bonding or wire bonding.

Figure 4:
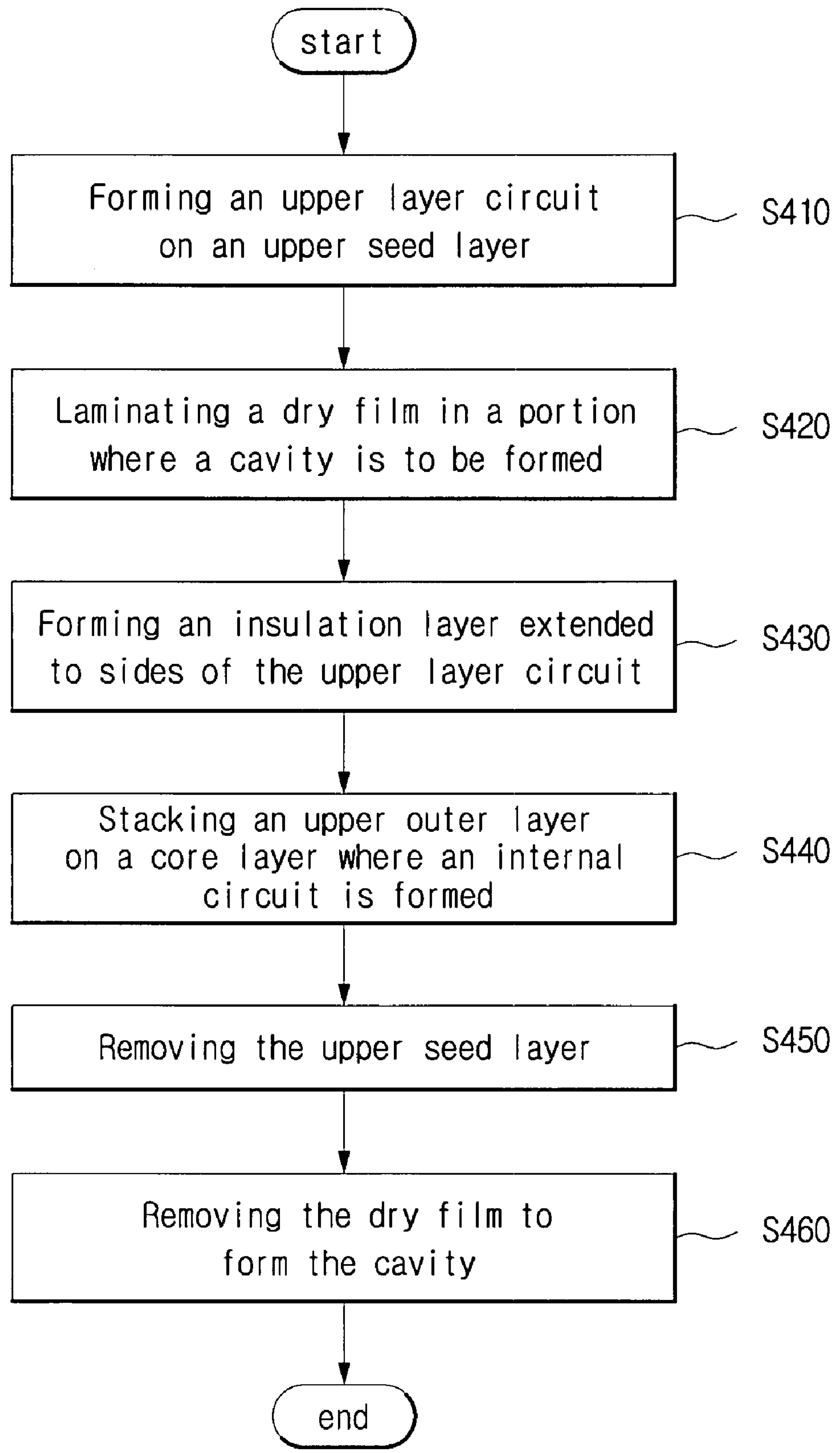
FIG. 4 is a flowchart illustrating a method for manufacturing a package on package according to an embodiment of the present invention.

FIG. 4 is a flowchart illustrating a method for manufacturing a package on package according to an embodiment of the present invention. According to this method, in order to form a cavity, upper and lower outer layers are fabricated, and then are stacked on a core layer.

At step S410, an upper layer circuit is formed on an upper seed layer. Here, the upper layer circuit refers to an external circuit formed above the core layer, and a lower layer circuit refers to an external circuit formed below the core layer. For the upper seed layer, any material can be used as long as it is cost effective, being widely used, and can be selectively etched without etching Cu patterns during a following etching process. Examples of such a material includes aluminum (Al), nickel (Ni), etc. To form the upper layer circuit, a dry film is laminated on the upper seed layer, and is patterned through light exposure and developing process. Here, pattern plating can be applied through a semi additive process (SAP) or a modified semi additive process (MSAP).

The semi-additive process forms a circuit pattern after forming a copper (Cu) seed layer through electroless plating, using a material that does not have a seed layer. That is, a plating resist is used on the surface of a copper foil, which is on the outer layer of a copper-clad laminate, and the plating resist in the portion where the circuit is to be formed is peeled off through exposure and developing processes. As a result, the surface of the outer copper foil becomes exposed, and the plating resist of only the portion where the circuit is not to be formed remains on the outer layer of the copper foil. By copper-plating on the surface, the plating resist is peeled off to form a copper plated circuit layer on the surface of the exposed outer copper foil, thereby forming a circuit pattern. Once the plating is completed, the remaining plating resist is peeled off, and the copper foil between the wiring in the formed circuits is dissolved off using flush etching, thereby completing the printed circuit board. When the copper foil layer is removed through flush etching, the upper edge of the copper plated circuit layer becomes also eroded, deteriorating the shape of the final printed circuit board as well as the aspect ratio of the cross-section of the circuit. To avoid this, the following process can be also carried out: In the semi-additive method, the copper plated circuit layer and outer layer copper foil layer must have the Rv value, which is Vsc/Vsp, of 1.0 or higher, whereas Vsp is the dissolving speed of the extracted copper constituting the copper plated circuit layer, and Vsc is the dissolving speed of the copper constituting the outer layer copper foil layer. The modified semi-additive process forms a circuit pattern using a material on which copper is laminated from the beginning, that is, a material having a seed layer. The rest of the process is identical to the above semi-additive process. For the seed layer of the present invention, nickel or aluminum can be used. Thus, since the materials for the seed layer and the circuit are different from each other, the seed layer can be selectively etched.

At step S420, the dry film used for the pattern plating is removed, and another dry film is again laminated on a portion where the cavity is to be formed. Otherwise, the dry film used for the pattern plating can be removed except from the portion where the cavity is to be formed.

At step S430, the upper outer layer is formed by laminating an insulation layer as high as the dry film laminated on the portion where the cavity is to be formed. Here, the insulation layer can be formed of an insulating material such as a prepreg, a resin coated copper foil (RCC) or a bonding sheet.

At step S440, the upper outer layer is stacked on the core layer on which an internal circuit is formed in a direction allowing the dry film to face the core layer. The upper seed layer is etched selectively at step S450, and then the dry film is removed at step S460, thereby forming the cavity.

Figure 5:
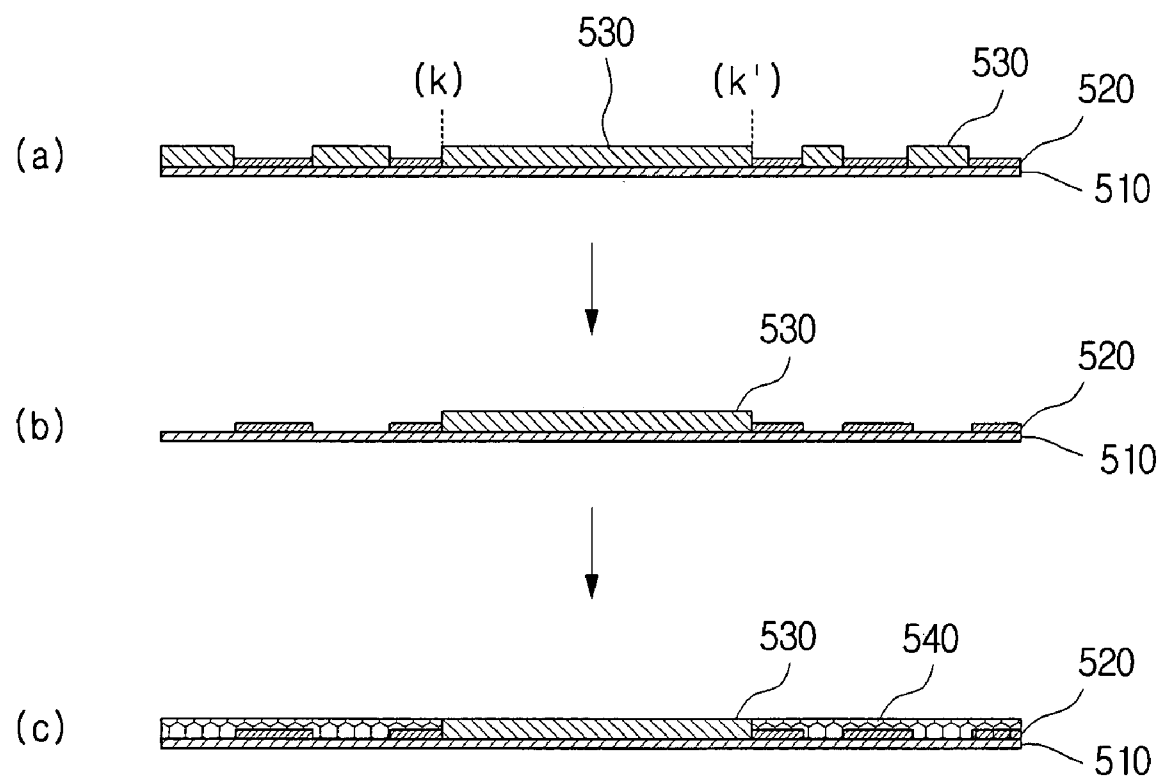
FIGS. 5 to 7 are sectional views showing a manufacturing process of a package on package according to an embodiment of the present invention.
Figure 6:
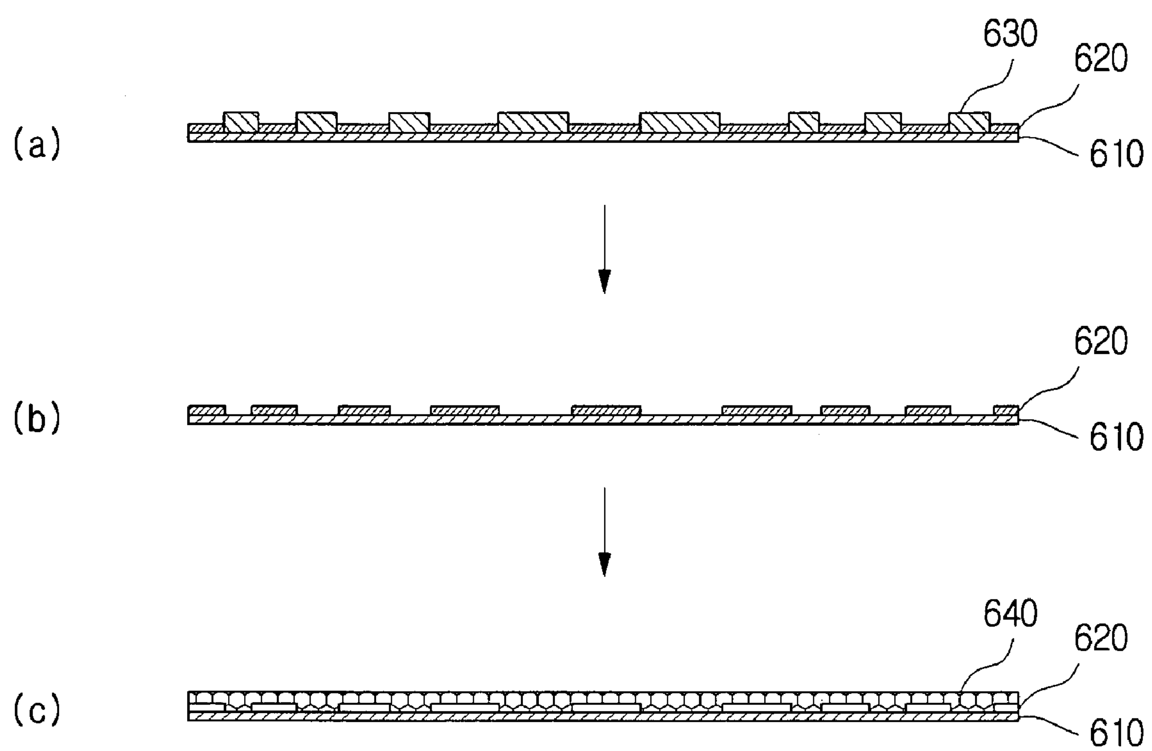
Figure 7:
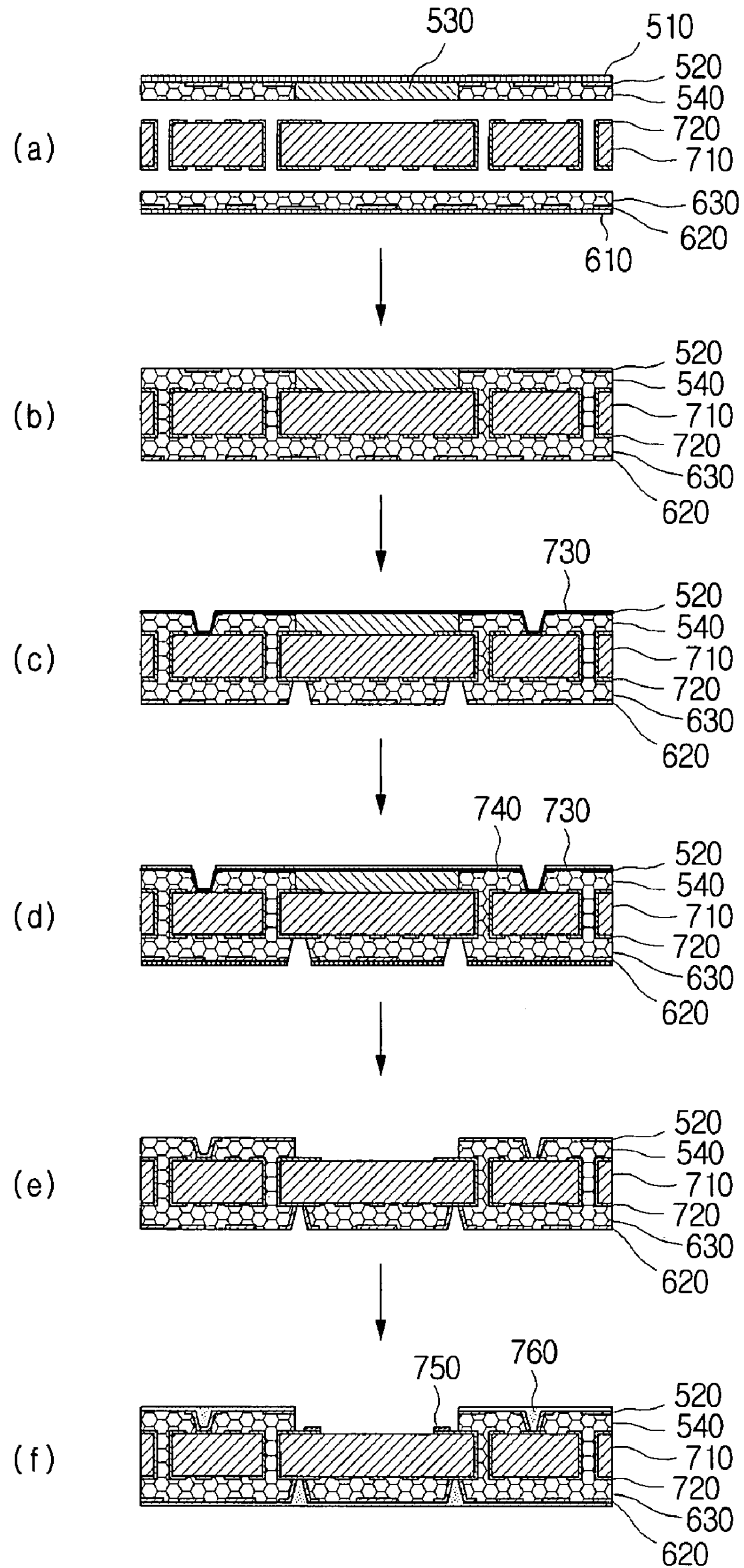

FIGS. 5 to 7 are sectional views illustrating a manufacturing process of a package on package with a cavity according to an embodiment of the present invention.

FIG. 5 illustrates a manufacturing process of an upper outer layer that is later stacked on the core layer.

Referring to step (a), after laminating a dry film 530 on an upper seed layer 510, and a circuit pattern corresponding to an upper layer circuit 520 is formed. Here, pattern plating can be applied through the semi additive process (SAP) or the modified semi additive process (MSAP). Here, the cavity is formed in a portion between dotted lines k and k', and such a portion is different from other portions where the cavity isn't formed in area and width.

Referring to step (b), the dry film 530, which is formed on the upper seed layer 510, is removed, and then another dry film 530 is again laminated on the portion between the dotted lines k and k'. This portion is later removed to form the cavity. A variety of solutions can be used to remove the dry film 530 (for example, NaOH). Here, in order to form the dry film 530 on the portion where the cavity is to be formed, the dry film 530 can be removed entirely, and then another dry film 530 can again be laminated on the portion where the cavity is to be formed. Otherwise, the dry film 530 used in the pattern plating process can be removed except from the portion where the cavity is to be formed.

Referring to step (c), an insulation layer 540 is laminated on the core layer as high as the dry film 530 laminated on the portion where the cavity is to be formed.

The insulation layer 540 is laminated on top and sides of the upper layer circuit 520 and on top of the upper seed layer 510.

Thus, even if the thickness of the insulation layer 540 is not changed, the total thickness of the substrate can decrease.

The insulation layer 540 can be composed of various insulating materials, and is pre-treated in order to improve adhesion strength between the plated pattern and the insulation layer.

FIG. 6 illustrates a manufacturing process of a lower outer layer that is later stacked on the core layer.

Referring to step (a), a dry film 630 is laminated on a lower seed layer 610, and then a circuit pattern corresponding to a lower layer circuit 620 is formed. Pattern plating can be applied through the semi additive process (SAP) or the modified semi additive process (MSAP).

Referring to step (b), the dry film 630, which is formed on the lower seed layer 610, is removed. A variety of solutions can be used to remove the dry film 630 (for example, NaOH).

Referring to step (c), the lower outer layer is formed by forming an insulation layer 640, which is to be laminated on the core layer. The insulation layer 640 is laminated on top and sides of the lower layer circuit 620 and on top of the lower seed layer 610. Thus, as described above, even if the thickness of the insulation layer 640 is not changed, the total thickness of the substrate can decrease.

FIG. 7 illustrates a process of stacking the upper and lower outer layers on the core layer.

Referring to step (a), the upper and lower outer layers are stacked on the core layer 710 where internal circuits 720 are formed. Here, the upper outer layer is stacked such that the dry film 530 and the insulation layer 540 of the upper outer layer face the core layer 710, and the lower outer layer is stacked such that the insulation layer 640 of the lower outer layer faces the core layer 710.

Referring to step (b), the upper seed layer 510 and the lower seed layer 610 are removed after stacking the upper and lower outer layers. Here, aluminum (Al) or nickel (Ni) can be etched by using an etching solution that does not etch Cu, which is a material for the external circuit (the upper layer circuit 520 and the lower layer circuit 620). The interstitial via holes (IVH) formed in the core layer 710 can be filled with an insulating material of which the insulation layers laminated on the upper and lower outer layers are composed (for example, resin).

Referring to step (c), after the upper seed layer 510 and the lower seed layer 610 are removed, a via hole is formed, and then flash plating process, which is electroless plating, is performed in order to electrically connect the external circuit (the upper layer circuit 520 and lower layer circuit 620) and the internal circuit 720.

Referring to step (d), after the flash plating process, a dry film 740 is laminated such that the via holes are not closed.

Referring to step (e), wires of the via holes are electrolytic-plated and the dry film 740 is removed. Thereafter, the flash plating is etched and the dry film 740 used to form the cavity is removed by an etching solution. An NaOH solution can be used as the etching solution.

Referring to step (f), a photo solder resist (PSR) 760 is coated by a surface treatment process, and a bonding pad 750 is formed by gold-plating. The bonding pad 750 can be a wire bonding pad or a flip-chip bonding pad, depending on a method for bonding the semiconductor chip.

While the invention has been described with reference to the disclosed embodiments, it is to be appreciated that those skilled in the art can change or modify the embodiments without departing from the scope and spirit of the invention or its equivalents as stated below in the claims.

What is claimed is:

1. A method for manufacturing a substrate with a cavity for mounting a semiconductor chip, the method comprising:

forming an upper layer circuit on an upper seed layer;

laminating a dry film selectively on a portion of the upper seed layer where the cavity is to be formed;

fabricating an upper outer layer by forming a first insulation layer as high as the dry film on top of the upper seed layer;

stacking the upper outer layer on one side of a core layer where an internal circuit is formed, such that the dry film is facing the core layer;

fully removing the upper seed layer;

removing the dry film such that the cavity is formed;

forming a lower layer circuit on a lower seed layer;

forming a lower outer layer by laminating a second insulation layer on to of the lower seed layer and on top and sides of the lower circuit;

laminating the lower outer layer on the other side of the core layer on which the internal circuit is formed; and removing the lower seed layer.

2. The method of claim 1 further comprising forming a bonding pad that is electrically connected with the semiconductor chip in the cavity.

* * * * *

UNITED STATES PATENT AND TRADEMARK OFFICE

CERTIFICATE OF CORRECTION

PATENT NO. : 7,858,437 B2
APPLICATION NO. : 11/706186
DATED : December 28, 2010
INVENTOR(S) : Hoe-Ku Jung et al.

It is certified that error appears in the above-identified patent and that said Letters Patent is hereby corrected as shown below:

Column 8, Line 14 in Claim 1 delete “to” and insert -- top --, therefor.

Column 8, Line 15 in Claim 1, delete “lower circuit;” and insert -- lower layer circuit; --, therefor.

Signed and Sealed this
Twelfth Day of April, 2011

David J. Kappos
*Director of the United States Patent and Trademark Office*